(12) United States Patent
Lin et al.

(10) Patent No.: US 12,439,681 B2
(45) Date of Patent: Oct. 7, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Ching-Ling Lin, Kaohsiung (TW); Wen-An Liang, Tainan (TW); Chen-Ming Huang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/613,151

(22) Filed: Mar. 22, 2024

(65) Prior Publication Data
US 2024/0282637 A1    Aug. 22, 2024

Related U.S. Application Data

(60) Continuation of application No. 18/088,631, filed on Dec. 26, 2022, now Pat. No. 11,972,984, which is a
(Continued)

(30) Foreign Application Priority Data

Dec. 4, 2017   (CN) .......................... 201711262580.1

(51) Int. Cl.
 *H01L 21/02* (2006.01)
 *H01L 21/764* (2006.01)
 (Continued)

(52) U.S. Cl.
 CPC ......... *H10D 84/038* (2025.01); *H01L 21/764* (2013.01); *H10D 30/024* (2025.01);
 (Continued)

(58) Field of Classification Search
 CPC .. H10D 30/024; H10D 30/62; H10D 84/0158; H10D 84/834; H10D 62/115; H10D 84/0151; H01L 21/764
 See application file for complete search history.

(56) References Cited

U.S. PATENT DOCUMENTS 6,268,637 B1   7/2001   Gardner
7,345,346 B2   3/2008   Hoshizaki
(Continued)

FOREIGN PATENT DOCUMENTS

CN   1967873 A     5/2007
CN   101359687 A   2/2009
(Continued)

OTHER PUBLICATIONS

Liu Yuan, Yifan Zhao, Jianqi Zhang et al., Oligomeric Donor Material for High-Efficiency Organic Solar Cells: Breaking Down a Polymer, Advanced Materials, 2015, vol. 27, wileyonlinelibrary. com, pp. 4229-4233, Jul. 22, 2015.

*Primary Examiner* — John A Bodnar
(74) *Attorney, Agent, or Firm* — Winston Hsu

(57) ABSTRACT

A semiconductor device includes a fin-shaped structure on a substrate, a gate structure on the fin-shaped structure and an interlayer dielectric (ILD) layer around the gate structure, and a single diffusion break (SDB) structure in the ILD layer and the fin-shaped structure. Preferably, the SDB structure includes a bottom portion and a top portion on the bottom portion, in which the top portion and the bottom portion include different widths.

10 Claims, 6 Drawing Sheets

Related U.S. Application Data continuation of application No. 16/859,959, filed on Apr. 27, 2020, now Pat. No. 11,569,133, which is a division of application No. 15/859,775, filed on Jan. 2, 2018, now Pat. No. 10,679,903.

(51) Int. Cl.

| | | |
|---|---|---|
| *H10D 30/01* | (2025.01) | |
| *H10D 30/62* | (2025.01) | |
| *H10D 62/10* | (2025.01) | |
| *H10D 64/01* | (2025.01) | |
| *H10D 84/01* | (2025.01) | |
| *H10D 84/03* | (2025.01) | |
| *H10D 84/83* | (2025.01) | |

(52) U.S. Cl.
CPC ........ *H10D 30/62* (2025.01); *H10D 62/115* (2025.01); *H10D 64/017* (2025.01); *H10D 84/0151* (2025.01); *H10D 84/0158* (2025.01); *H10D 84/834* (2025.01)

(56) References Cited

U.S. PATENT DOCUMENTS

| | | | |
|---|---|---|---|
| 8,053,299 B2 | 11/2011 | Xu | |
| 8,278,184 B1 | 10/2012 | Chen | |
| 8,735,991 B2 | 5/2014 | Shieh | |
| 9,490,176 B2 | 11/2016 | Chang | |
| 9,502,412 B2 | 11/2016 | Liu | |
| 9,564,369 B1 | 2/2017 | Kim | |
| 9,570,339 B2 | 2/2017 | Liou | |
| 9,589,845 B1 | 3/2017 | Jagannathan | |
| 9,608,062 B1 | 3/2017 | Tseng | |
| 9,660,022 B2 | 5/2017 | Liou et al. | |
| 9,768,166 B1 | 9/2017 | Cheng | |
| 9,780,200 B2 | 10/2017 | Zhu | |
| 9,941,161 B2 | 4/2018 | Liao | |
| 9,947,792 B2 | 4/2018 | Feng | |
| 10,115,722 B2 | 10/2018 | Oh | |
| 2013/0140639 A1 | 6/2013 | Shieh | |
| 2014/0231924 A1* | 8/2014 | Kuo | H10D 30/024 438/283 |
| 2015/0021710 A1 | 1/2015 | Hsu | |
| 2015/0243663 A1 | 8/2015 | Hung | |
| 2016/0020210 A1 | 1/2016 | Liaw | |
| 2016/0043170 A1 | 2/2016 | Park | |
| 2016/0056181 A1 | 2/2016 | Anderson et al. | |
| 2016/0111336 A1 | 4/2016 | Chang | |
| 2016/0111425 A1 | 4/2016 | Chen | |
| 2016/0190130 A1 | 6/2016 | Yu | |
| 2016/0268392 A1 | 9/2016 | Zhu | |
| 2016/0276429 A1* | 9/2016 | Tseng | H10D 84/834 |
| 2016/0336234 A1* | 11/2016 | Kim | H10D 84/0151 |
| 2016/0336417 A1 | 11/2016 | Hsiao | |
| 2017/0012000 A1 | 1/2017 | Tseng | |
| 2017/0053980 A1 | 2/2017 | Liou | |
| 2017/0287933 A1 | 10/2017 | Chen | |
| 2018/0033699 A1 | 2/2018 | Zhu | |
| 2018/0337178 A1 | 11/2018 | Fan | |

FOREIGN PATENT DOCUMENTS

| | | | |
|---|---|---|---|
| CN | 101866885 A | 10/2010 | |
| CN | 103137624 A | 6/2013 | |
| CN | 103779211 A | 5/2014 | |
| CN | 104681557 A | 6/2015 | |
| CN | 104867823 A | 8/2015 | |
| CN | 105789275 A | 7/2016 | |
| CN | 106158748 A | 11/2016 | |
| CN | 106158864 A | 11/2016 | |
| CN | 106298485 A | 1/2017 | |
| CN | 106409764 A | 2/2017 | |
| CN | 106711046 A | 5/2017 | |
| CN | 107346739 A | 11/2017 | |
| CN | 107393921 A | 11/2017 | |

* cited by examiner

SEMICONDUCTOR DEVICE AND METHOD FOR FABRICATING THE SAME

CROSS REFERENCE TO RELATED APPLICATIONS

This application is a continuation application of U.S. application Ser. No. 18/088,631, filed on Dec. 26, 2022, which is a continuation application of U.S. application Ser. No. 16/859,959, filed on Apr. 27, 2020, which is a division of U.S. application Ser. No. 15/859,775, filed on Jan. 2, 2018. The contents of these applications are incorporated herein by reference.

BACKGROUND OF THE INVENTION

1. Field of the Invention

The invention relates to a method for fabricating semiconductor device, and more particularly to a method for dividing fin-shaped structure to form single diffusion break (SDB) structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure part of the fin-shaped structure and part of the STI could be removed to form a trench, and insulating material is deposited into the trench to form single diffusion break (SDB) structure or isolation structure. However, the integration of the SDB structure and metal gate fabrication still remains numerous problems. Hence how to improve the current FinFET fabrication and structure has become an important task in this field.

SUMMARY OF THE INVENTION

According to an embodiment of the present invention, a method for fabricating semiconductor device includes the steps of: forming a fin-shaped structure on a substrate; forming a first gate structure and a second gate structure on the fin-shaped structure and an interlayer dielectric (ILD) layer around the first gate structure and the second gate structure; transforming the first gate structure and the second gate structure into a first metal gate and a second metal gate; forming a hard mask on the first metal gate and the second metal gate; removing part of the hard mask, the second metal gate, and part of the fin-shaped structure to form a trench; and forming a dielectric layer into the trench to form a single diffusion break (SDB) structure.

According to another aspect of the present invention, a semiconductor device includes: a fin-shaped structure on a substrate; a gate structure on the fin-shaped structure and an interlayer dielectric (ILD) layer around the gate structure; and a single diffusion break (SDB) structure in the ILD layer and the fin-shaped structure. Preferably, the SDB structure includes a bottom portion and a top portion on the bottom portion, in which the top portion and the bottom portion comprise different widths.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
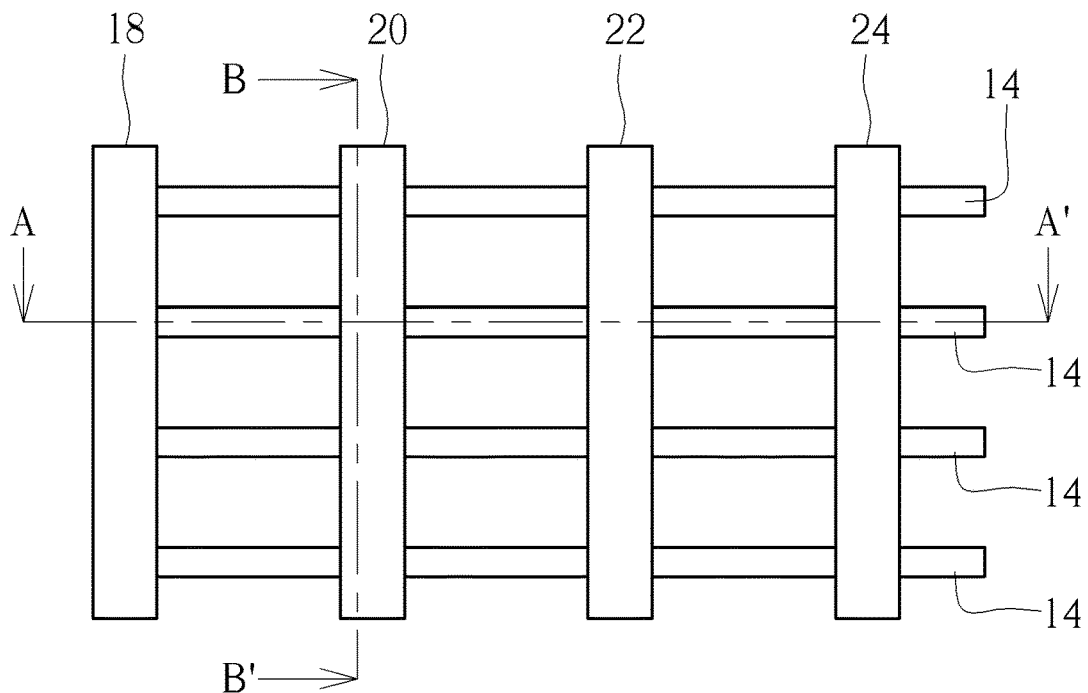
FIG. 1 is a top view illustrating a method for fabricating a semiconductor device according to an embodiment of the present invention.
Figure 2:
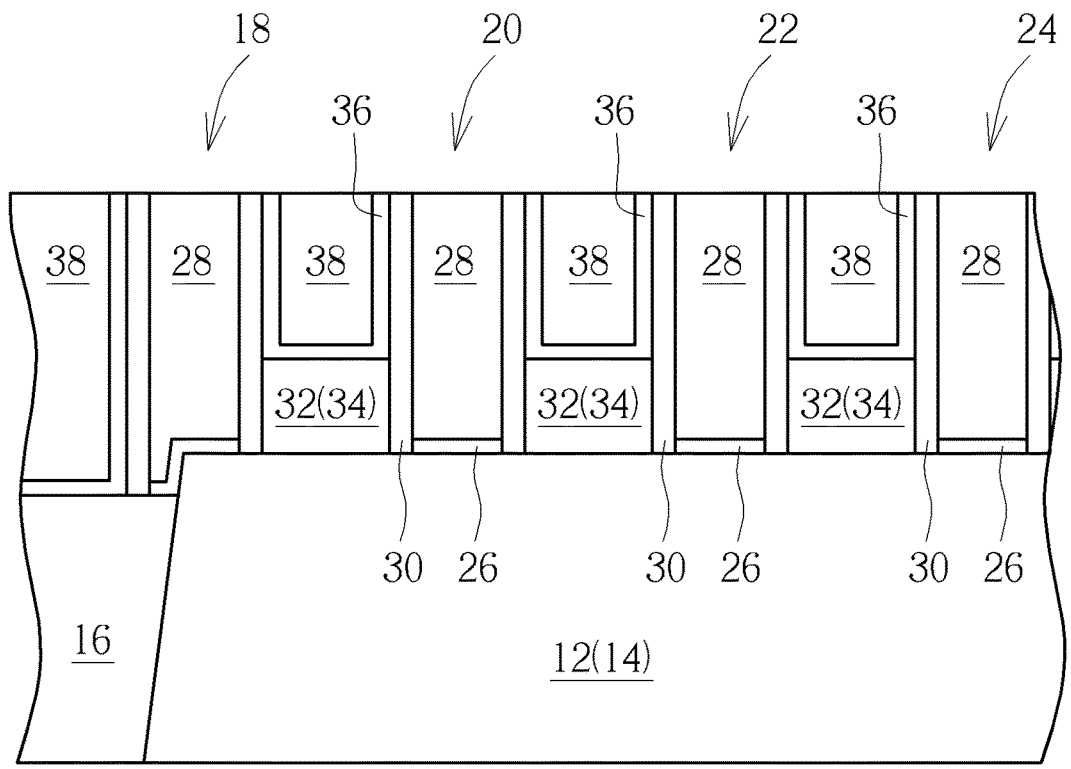
FIG. 2 illustrates a cross-sectional view of FIG. 1 for fabricating the semiconductor device along the sectional line AA'.

Referring to FIGS. 1-10, in which FIG. 1 is a top view illustrating a method for fabricating a semiconductor device according to an embodiment of the present invention, FIG. 2 illustrates a cross-sectional view of FIG. 1 for fabricating the semiconductor device along the sectional line AA', and FIGS. 3-10 illustrate a method for fabricating the semiconductor device following FIG. 2. As shown in FIGS. 1-2, a substrate 12, such as a silicon substrate or silicon-on-insulator (SOI) substrate is first provided, and a plurality of fin-shaped structures 14 are formed on the substrate 12. It should be noted that even though four fin-shaped structures 14 are disposed on the substrate 12 in this embodiment, it would also be desirable to adjust the number of fin-shaped structures 14 depending on the demand of the product, which is also within the scope of the present invention.

Preferably, the fin-shaped structures 14 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 14 could also be obtained by first forming a patterned mask (not shown) on the substrate, 12, and through an etching process, the pattern of the patterned mask is transferred to the substrate 12 to form the fin-shaped structures 14. Moreover, the formation of the fin-shaped structures 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 14. These approaches for forming fin-shaped structure are all within the scope of the present invention.

Next, a shallow trench isolation (STI) 16 is formed around the fin-shaped structures 14. In this embodiment, the formation of the STI 16 could be accomplished by conducting a flowable chemical vapor deposition (FCVD) process to form a silicon oxide layer on the substrate 12 and covering the fin-shaped structures 14 entirely. Next, a chemical mechanical polishing (CMP) process along with an etching process are conducted to remove part of the silicon oxide layer so that the top surface of the remaining silicon oxide is slightly lower than the top surface of the fin-shaped structures 14 for forming the STI 16.

Next, gates structures 18, 20, 22, 24 or dummy gates are formed on the fin-shaped structure 14. In this embodiment, the formation of the gate structures 18, 20, 22, 24 could be accomplished by a gate first process, a high-k first approach from gate last process, or a high-k last approach from gate last process. Since this embodiment pertains to a high-k last approach, a gate dielectric layer or interfacial layer, a gate material layer made of polysilicon, and a selective hard mask could be formed sequentially on the substrate 12, and a photo-etching process is then conducted by using a patterned resist (not shown) as mask to remove part of the gate material layer and part of the gate dielectric layer through single or multiple etching processes. After stripping the patterned resist, gate structures 18, 20, 22, 24 each composed of a patterned gate dielectric layer 26 and a patterned material layer 28 are formed on the fin-shaped structure 14.

Next, at least a spacer 30 is formed on the sidewalls of the each of the gate structures 18, 20, 22, 24, a source/drain region 32 and/or epitaxial layer 34 is formed in the fin-shaped structure 14 adjacent to two sides of the spacer 30, and selective silicide layers (not shown) could be formed on the surface of the source/drain regions 32. In this embodiment, the spacer 30 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 32 could include n-type dopants or p-type dopants depending on the type of device being fabricated.

Next, a contact etch stop layer (CESL) 36 is formed on the gate structures 18, 20, 22, 24 and the STI 16, and an interlayer dielectric (ILD) layer 38 is formed on the CESL 36. Next, a planarizing process such as CMP is conducted to remove part of the ILD layer 38 and part of the CESL 36 for exposing the gate material layer 28 made of polysilicon, in which the top surface of the gate material layer 28 is even with the top surface of the ILD layer 36.

Figure 3:
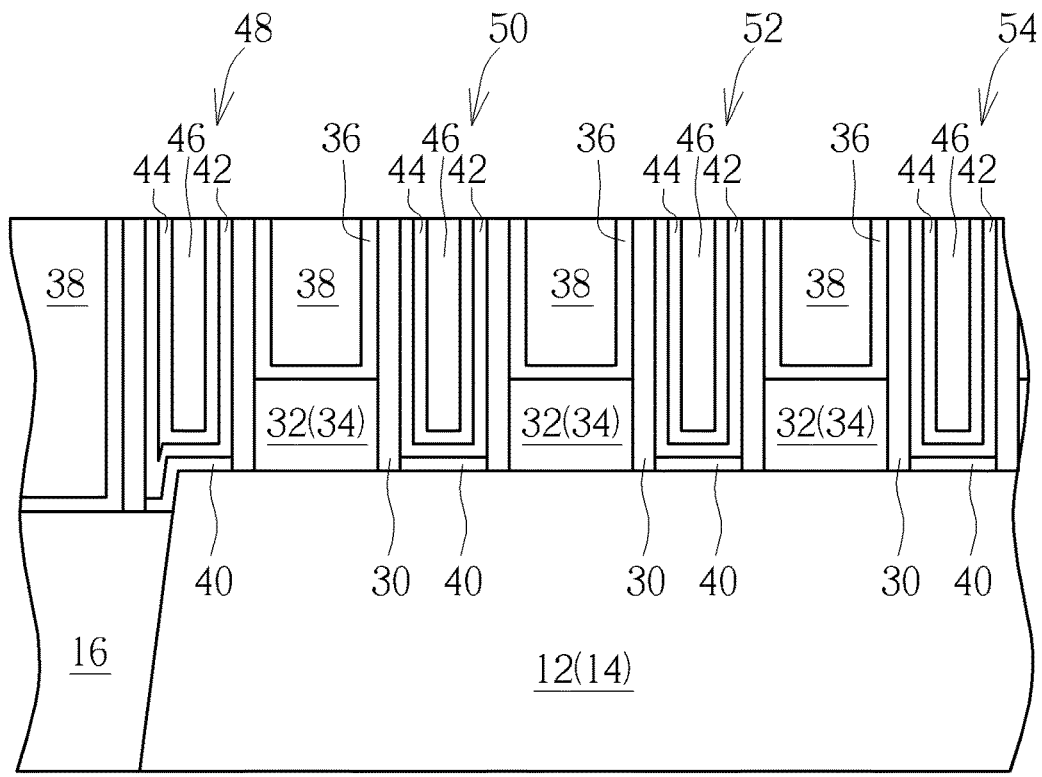
FIGS. 3-10 illustrate a method for fabricating the semiconductor device following FIG. 2.

Next, as shown in FIG. 3, a replacement metal gate (RMG) process is conducted to transform the gate structures 18, 20, 22, 24 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 28 and even gate dielectric layer 26 from each of the gate structures 18, 20, 22, 24 for forming recesses (not shown) in the ILD layer 38.

Next, a selective interfacial layer 40 or gate dielectric layer (not shown), a high-k dielectric layer 42, a work function metal layer 44, and a low resistance metal layer 46 are formed in the recesses, and a planarizing process such as CMP is conducted to remove part of low resistance metal layer 46, part of work function metal layer 44, and part of high-k dielectric layer 42 to form metal gates 48, 50, 52, 54. In this embodiment, the gate structures or metal gates 48, 50, 58, 54 fabricated through high-k last process of a gate last process preferably includes an interfacial layer 40 or gate dielectric layer (not shown), a U-shaped high-k dielectric layer 42, a U-shaped work function metal layer 44, and a low resistance metal layer 46.

In this embodiment, the high-k dielectric layer 42 is preferably selected from dielectric materials having dielectric constant (k value) larger than 4. For instance, the high-k dielectric layer 50 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 44 is formed for tuning the work function of the metal gate in accordance with the conductivity of the device. For an NMOS transistor, the work function metal layer 44 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 44 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 44 and the low resistance metal layer 46, in which the material of the barrier layer may include titanium (Ti), titanium nitride (TiN), tantalum (Ta) or tantalum nitride (TaN). Furthermore, the material of the low-resistance metal layer 46 may include copper (Cu), aluminum (Al), titanium aluminum (TiAl), cobalt tungsten phosphide (CoWP) or any combination thereof.

Figure 4:
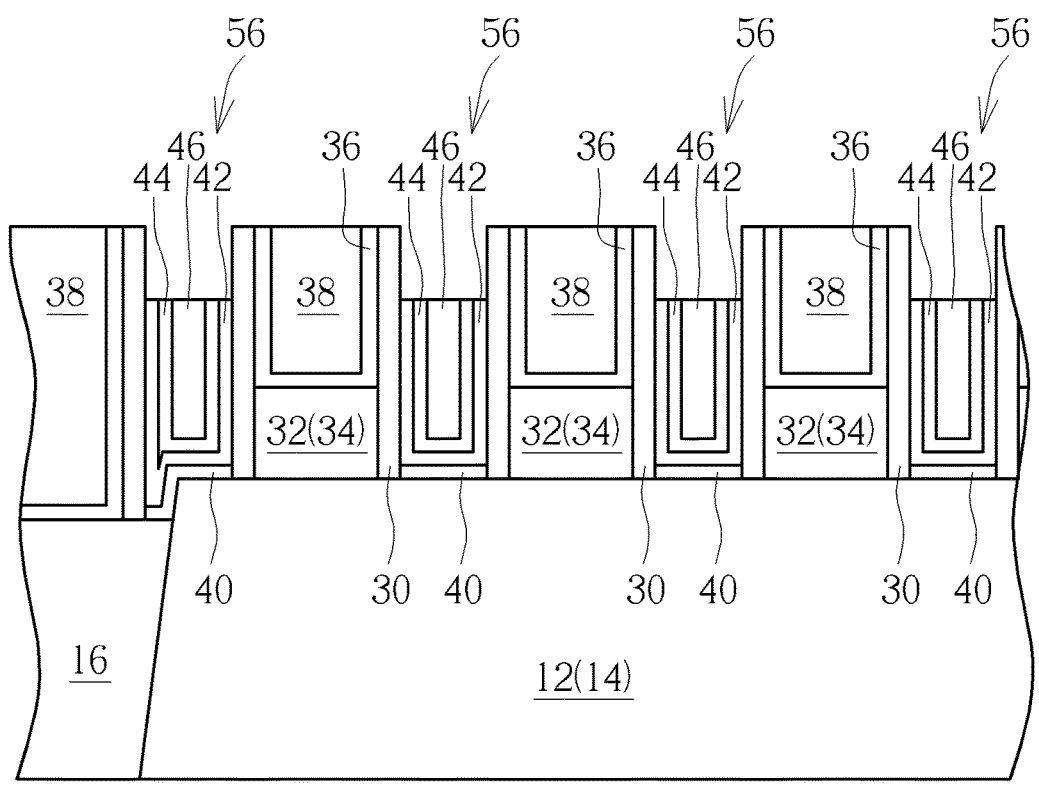

Next, as shown in FIG. 4, an etching process is conducted to remove part of the low resistance metal layer 46, part of the work function metal layer 44, and part of the high-k dielectric layer 42 for forming recesses 56.

Figure 5:
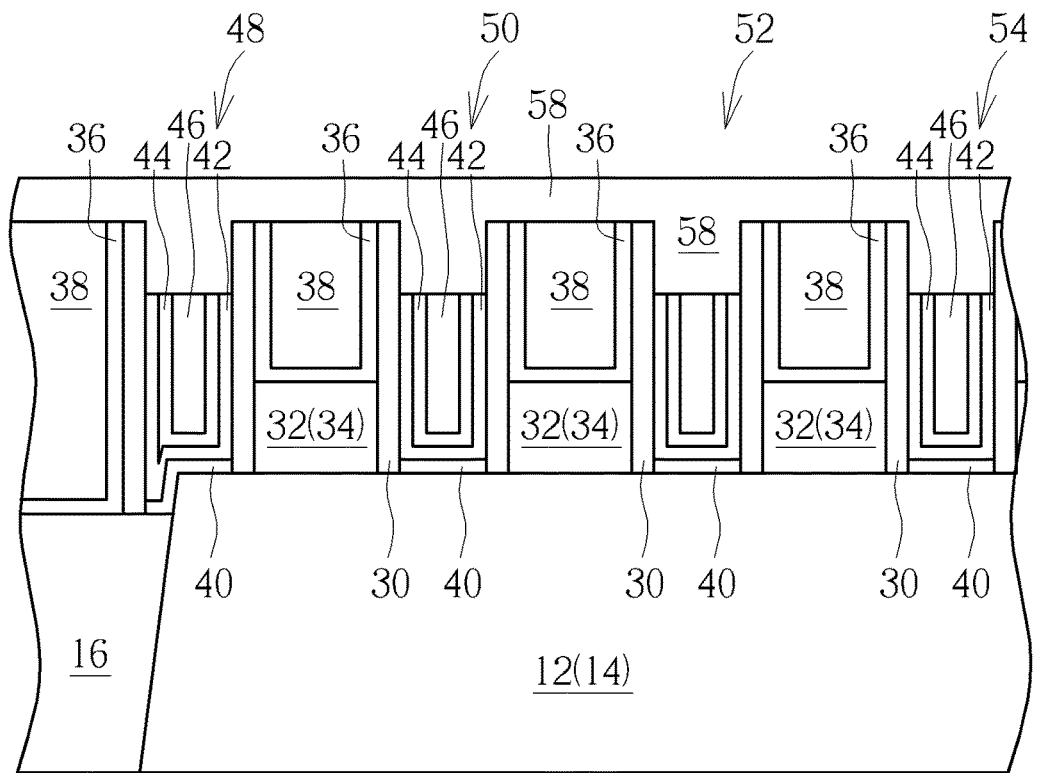

Next, as shown in FIG. 5, a hard mask 58 is formed to fill the recesses 56 and disposed on the CESL 36 and the ILD layer 38. In this embodiment, the hard mask 58 is made of dielectric material including but not limited to for example silicon nitride.

Figure 6:
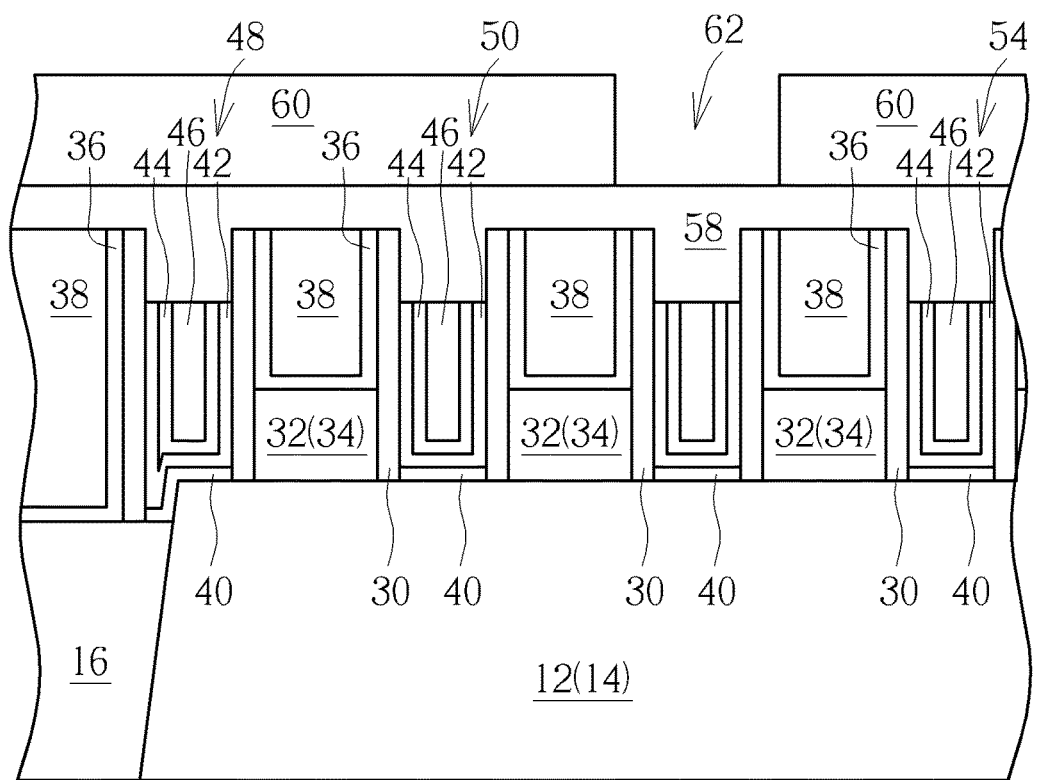

Next, as shown in FIG. 6, a patterned mask such as a patterned resist 60 is formed on the hard mask 58, in which the patterned resist 60 includes an opening 62 exposing part of the hard mask 58 surface.

Figure 7:
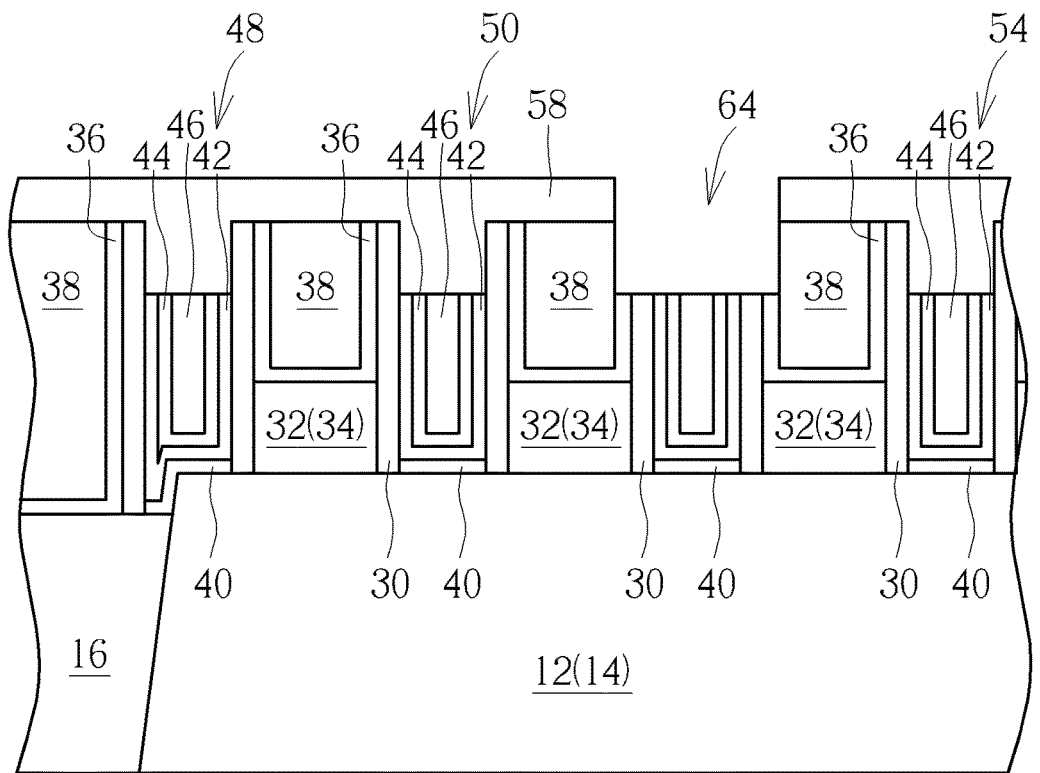

Next, as shown in FIG. 7, an etching process or more specifically one or more etching processes are conducted by using the patterned resist 60 as mask to remove part of the hard mask 58, part of the CESL 36, part of the spacer 30, and part of the metal gate 52 for forming a trench 64 in the ILD layer 38 and the hard mask 58 directly above the metal gate 52, and the patterned resist 60 is removed thereafter. In this embodiment, the removal of part of the hard mask 58 could be accomplished by using an etching gas such as but not limited to for example carbon tetrafluoride ($CF_4$).

Figure 8:
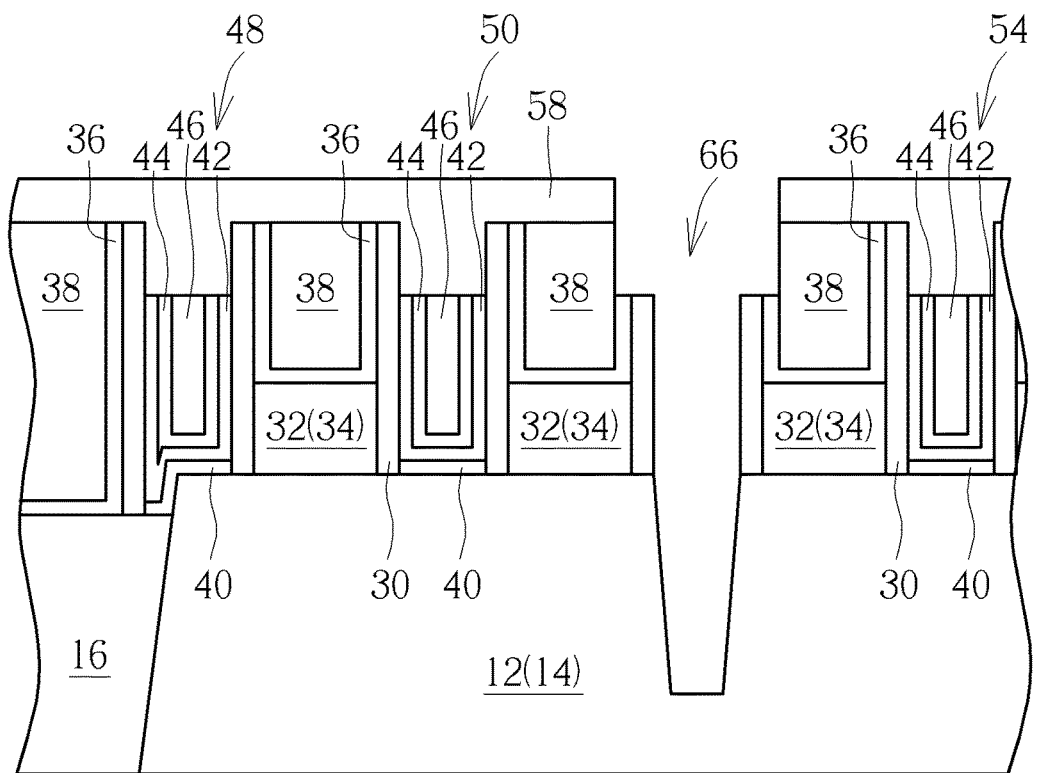

Next, as shown in FIG. 8, another etching process or one or more additional etching process could be conducted by using the patterned hard mask 58 as mask to remove the remaining metal gate 52 and part of the fin-shaped structure 14 directly under the metal gate 52. This forms a substantially T-shaped trench 66 in the spot of the original metal gate 52 and the lower portion of the trench 66 is preferably extended into the fin-shaped structure 14. In this embodiment, the removal of the remaining metal gate 52 could be accomplished by using an etching such as but not limited to for example sulfur hexafluoride ($SF_6$).

It should be noted that since the trench 66 is formed by removing the original metal gate 52, the extending direction of the trench 66 is preferably the same as the extending direction of the original gate structure 22 or metal gate 52. In other words, in contrast to the fin-shaped structures 14 extending along a first direction (such as X-direction) shown in FIG. 1, the trench 66 is preferably extending along a second direction (such as Y-direction) orthogonal to the first direction.

Figure 9:
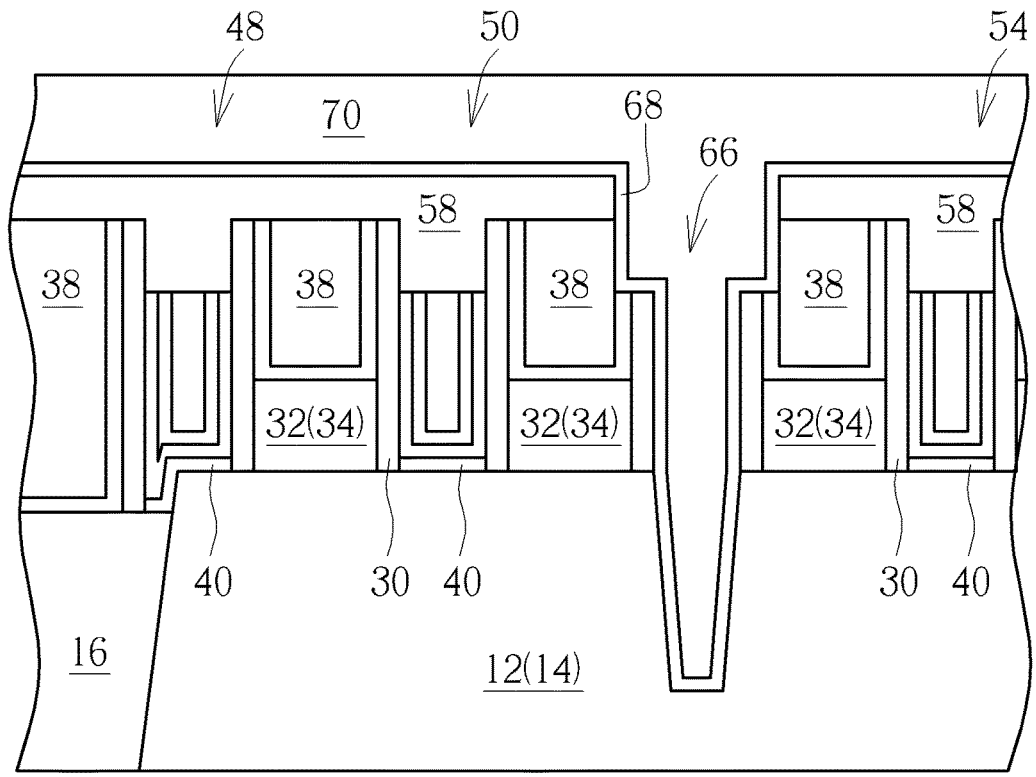

Next, as shown in FIG. 9, a liner 68 and a dielectric layer 70 are sequentially formed on the hard mask 58 and filled into the trench 66, in which the liner 68 and the dielectric layer 70 are preferably made of different material while the two layers 68 and 70 could be selected from the group consisting of silicon oxide and silicon nitride. For example, it would be desirable to sequentially deposit a liner 68 made of silicon nitride and a dielectric layer 70 made of silicon oxide into the trench 66, or sequentially deposit a liner 68 made of silicon oxide and a dielectric layer 70 made of silicon nitride into the trench 66, which are all within the scope of the present invention.

Figure 10:
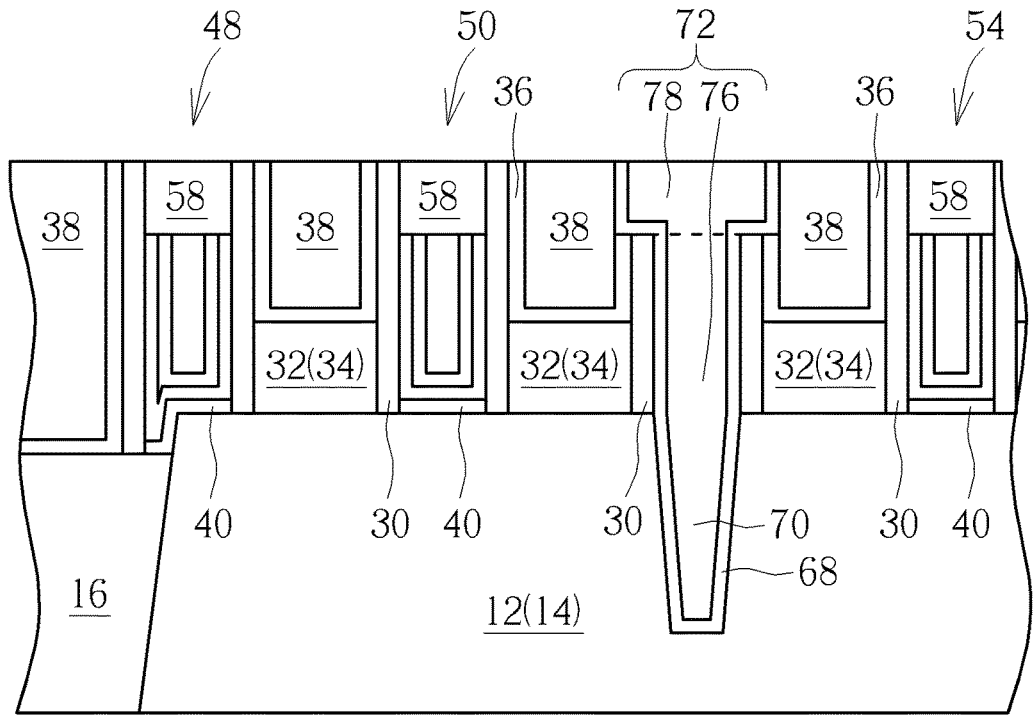

Next, as shown in FIG. 10, a planarizing process such as CMP and/or etching back process is conducted to remove part of the dielectric layer 70, part of the liner 68, and part of the hard mask 58 so that the top surface of the remaining dielectric layer 70 and liner 68 is even with the top surface of the ILD layer 38 and the remaining hard mask 58 to form a single diffusion break (SDB) structure 72. Similar to the extending direction of the trench 66, the SDB structure 72 formed at this stage is also extending along a second direction (such as Y-direction) orthogonal to the first direction (such as X-direction) of the fin-shaped structures 14 shown in FIG. 1.

Referring again to FIG. 10, which further illustrates a structural view of a semiconductor device according to an embodiment of the present invention. As shown in FIG. 10, the semiconductor device includes a fin-shaped structure 14 on the substrate 12, gate structure or metal gate 48, 50, 54 disposed on the fin-shaped structure 14, an ILD layer 38 surrounding the metal gates 48, 50, 54, a SDB structure 72 disposed in the ILD layer 38 and the fin-shaped structure 14, a spacer 30 around the metal gates 48, 50, 54, and the SDB structures 72, and a CESL 36 disposed between the spacers 30.

Viewing from a more detailed perspective, the SDB structure 72 further includes a bottom portion 76 and a top portion 78 on the bottom portion 76, in which the top portion 78 and the bottom portion 76 include different widths, or more specifically the width of the top portion 78 is preferably greater than the width of the bottom portion 76. Each of the top portion 78 and the bottom portion 76 also includes a liner 68 and a dielectric layer 70 disposed on the liner 68 and the liner 68 and the dielectric layer 70 are preferably made of different material.

It should be noted that the spacers 30 surrounding the metal gates 48, 50, 54 and the SDB structure 72 preferably include different heights. For instance, the top surface of the spacer 30 surrounding the metal gate 50 is even with the top surface of the ILD layer 38 and higher than the top surface of the spacer 30 surrounding the SDB structure 72, and the top surface of the spacer 30 surrounding the SDB structure 72 on the other hand is even with the top surfaces of the bottom portion 76 and the CESL 36. It should also be noted that even though the CESL 36 has a relatively U-shaped cross-section, the top surface of the CESL 36 adjacent to the SDB structure 72 is slightly lower than the top surface of the CESL 36 adjacent to the metal gate 50.

Figure 11:
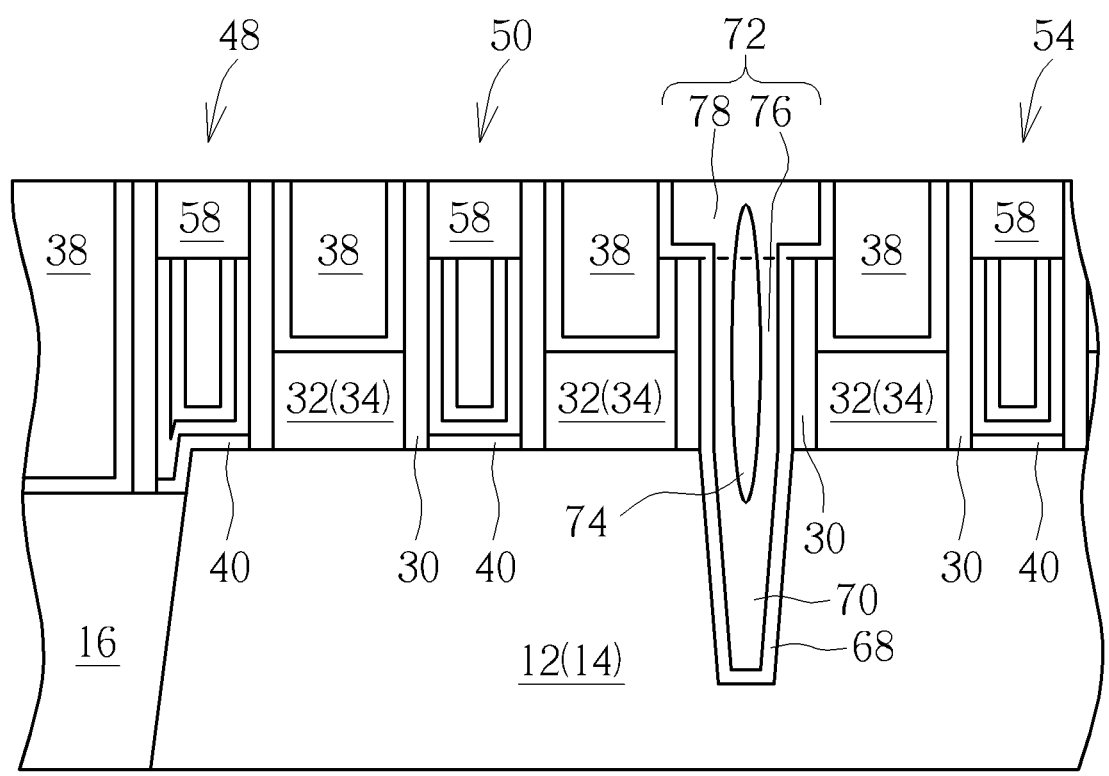
FIG. 11 illustrates a structural view of a semiconductor device according to an embodiment of the present invention.

Referring to FIG. 11, FIG. 11 illustrates a structural view of a semiconductor device according to an embodiment of the present invention. As shown in FIG. 11, it would also be desirable to conduct the planarizing process including a CMP process and/or etching back to remove part of the dielectric layer 70, part of the liner 68, and part of the hard mask 58 for forming the SDB structure 72 while forming an air gap 74 within the SDB structure 72, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a fin-shaped structure on a substrate;
   a gate structure on the fin-shaped structure and an interlayer dielectric (ILD) layer around the gate structure;
   an epitaxial layer adjacent to the gate structure;
   a single diffusion break (SDB) structure in the ILD layer and the fin-shaped structure, wherein the SDB structure comprises:
     a bottom portion comprising a first width and a second width, wherein a top surface of the bottom portion is higher than a top surface of the epitaxial layer; and
     a top portion on the bottom portion, wherein the top portion comprise a third width and a top surface of the bottom portion is higher than a top surface of the fin-shaped structure.

2. The semiconductor device of claim 1, further comprising:
   a first spacer around the gate structure;
   a second spacer around the SDB structure; and
   a contact etch stop layer (CESL) between the first spacer and the second spacer.

3. The semiconductor device of claim 2, wherein the first spacer and the second spacer comprise different heights.

4. The semiconductor device of claim 2, wherein the CESL is U-shaped.

5. The semiconductor device of claim 2, wherein a top surface of the CESL adjacent to the second spacer is lower than a top surface of the CESL adjacent to the first spacer.

6. The semiconductor device of claim 1, wherein a top surface of the bottom portion is even with a top surface of the gate structure.

7. The semiconductor device of claim 1, wherein the SDB structure comprises:

a liner; and a dielectric layer on the liner, wherein the liner and the dielectric layer comprise different material.

8. The semiconductor device of claim 1, further comprising an air gap in the SDB structure.

9. The semiconductor device of claim 1, wherein the fin-shaped structure is disposed extending along a first direction and the SDB structure is disposed extending along a second direction.

10. The semiconductor device of claim 9, wherein the first direction is orthogonal to the second direction.

* * * * *